United States Patent
Cheng et al.

(10) Patent No.: US 9,638,994 B2
(45) Date of Patent: May 2, 2017

(54) METHOD AND SYSTEM FOR OPTICAL PROXIMITY CORRECTION (OPC)

(71) Applicant: Semiconductor Manufacturing International (Shanghai) Corporation, Shanghai (CN)

(72) Inventors: Renqiang Cheng, Shanghai (CN); Hui Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 186 days.

(21) Appl. No.: 14/657,612

(22) Filed: Mar. 13, 2015

(65) Prior Publication Data

US 2015/0286131 A1 Oct. 8, 2015

(30) Foreign Application Priority Data

Apr. 2, 2014 (CN) .......................... 2014 1 0131227

(51) Int. Cl.
*G03F 1/36* (2012.01)
*G06F 17/50* (2006.01)

(52) U.S. Cl.
CPC ............ *G03F 1/36* (2013.01); *G06F 17/5009* (2013.01)

(58) Field of Classification Search
CPC ........................................................ G03F 1/36
USPC ........................................................ 430/5, 30
See application file for complete search history.

(56) References Cited

U.S. PATENT DOCUMENTS

| | | | | |
|---|---|---|---|---|
| 6,171,731 B1 * | 1/2001 | Medvedeva | ............ | G03F 7/705 430/5 |
| 6,263,299 B1 * | 7/2001 | Aleshin | ................... | G03F 7/705 382/280 |
| 6,834,262 B1 * | 12/2004 | Balasinski | ................ | G03F 1/36 703/13 |

\* cited by examiner

*Primary Examiner* — Christopher Young
(74) *Attorney, Agent, or Firm* — Anova Law Group, PLLC (57) ABSTRACT

An Optical Proximity Correction (OPC) method is provided for compensating the Optical Proximity Effect (OPE) influence. The method include providing a substrate having at least one semiconductor structure and with a plurality of regions, providing a target pattern to be formed on the substrate, and respectively obtaining aerial image light intensity functions of the plurality of regions of the substrate. The method also includes establishing an OPC model based on the aerial image light intensity functions of the plurality of regions, and performing an OPC process to the target pattern by using the OPC model to adjust the target pattern factoring in optical effect of the plurality of regions.

20 Claims, 5 Drawing Sheets

METHOD AND SYSTEM FOR OPTICAL PROXIMITY CORRECTION (OPC)

CROSS-REFERENCES TO RELATED APPLICATIONS

This application claims the priority of Chinese patent application no. CN201410131227.X, filed on Apr. 2, 2014, the entire contents of all of which are incorporated herein by reference.

FIELD OF THE INVENTION

The present invention relates to the field of semiconductor manufacturing processes technology and, more particularly, relates to an Optical Proximity Correction (OPC) method and a method for optimizing an OPC model.

BACKGROUND

With rapid development on semiconductor manufacturing processes technology, feature size of semiconductor devices continues to shrink to meet the requirements for miniaturization, low power consumption, and high-degree-integration. As the feature size decreasing, light diffraction effect in photolithography becomes more and more obvious. This may generate dimension variation between the fabricated pattern and the designed mask and may degrade image fidelity. This phenomena is known as the Optical Proximity Effect (OPE). To compensate this OPE influence, a photolithography enhancement technique Optical Proximity Correction (OPC) is commonly used. During an OPC process, an OPC model may be developed to cancel the OPE influence. Then, the OPC model may be applied in the mask design process. Thus, the finally fabricated pattern may be much closer to the desired pattern, even when the OPE still exists, because the mask design process may already factor in the OPE influence.

However, in real scenarios, when forming certain structures with insulators in the substrate, the pattern on the surface of the substrate may still have some variations from the target patterns even after an OPC process. This may result in a poor quality of the fabricated semiconductor devices. The disclosed methods are directed to solve one or more problems set forth above and other problems.

BRIEF SUMMARY OF THE DISCLOSURE

One aspect of the present disclosure includes an Optical Proximity Correction (OPC) method for compensating the Optical Proximity Effect (OPE) influence. The method include providing a substrate having at least one semiconductor structure and with a plurality of regions, providing a target pattern to be formed on the substrate, and respectively obtaining aerial image light intensity functions of the plurality of regions of the substrate. The method also includes establishing an OPC model based on the aerial image light intensity functions of the plurality of regions, and performing an OPC process to the target pattern by using the OPC model to adjust the target pattern factoring in optical effect of the plurality of regions.

Another aspect of the present disclosure includes a method for optimizing an OPC model. The method includes providing a substrate having at least one semiconductor structure and with a plurality of regions, obtaining aerial image light intensity functions at the first region, the second region and third region, and establishing an OPC model based on the obtained aerial image light intensity functions. The method also includes providing a plurality of testing patterns, forming simulated final patterns by simulating a photo lithographical process on these target patterns based on the OPC model, and forming actual final patterns on a surface of the substrate by performing a real exposure and developing process using the testing patterns as masks. Further, the method includes obtaining variations between the simulated final patterns and the actual final patterns, and adjusting the OPC model and repeating the simulation and fabrication process until the variations between the simulated final patterns and the actual final patterns are within a predetermined range to obtain a desired OPC model.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

As mentioned in the background section, when a semiconductor substrate has certain structure such as STIs, there may be some variations between the finally formed patterns on the substrate and the target patterns.

Figure 1:
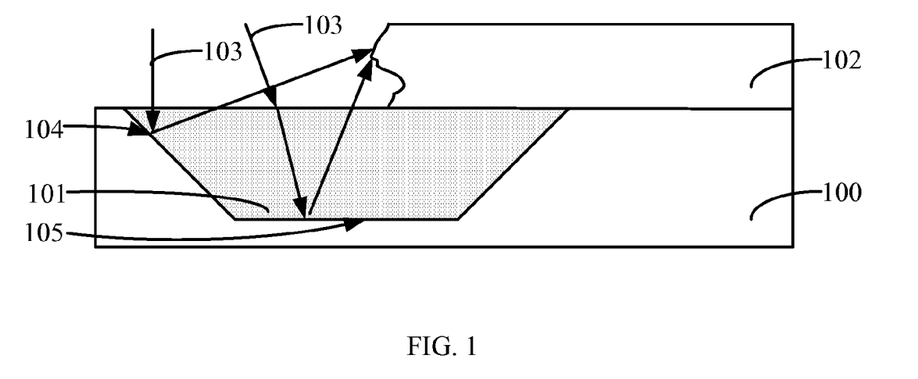
FIGS. 1-2 illustrate the OPE influence consistent with the disclosed embodiments.
Figure 2:
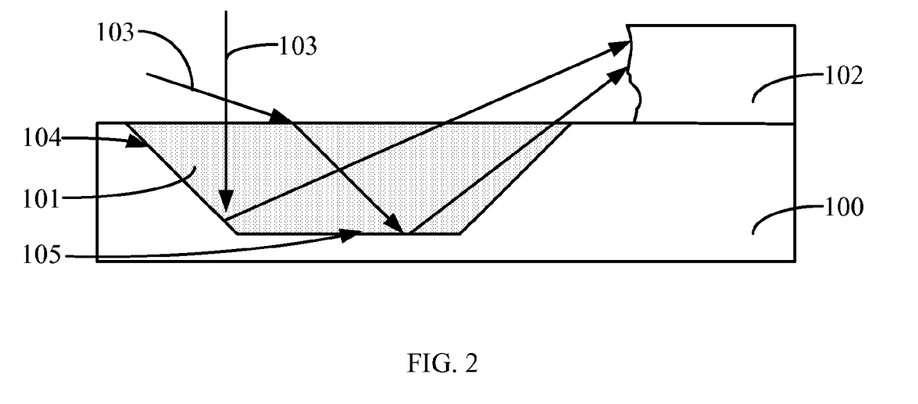

As shown in FIGS. 1-2, to form a photoresist layer having a target pattern, a semiconductor substrate 100 is provided. The substrate 100 has an insulator structure 101, and a photoresist layer is formed on the top surface of the substrate 100. Further, an OPC process is performed on the target pattern to obtain a target pattern with OPC. The target pattern with OPC is then written into a mask template.

Using the mask template having the target pattern with OPC as a mask, the photoresist layer is exposed and developed to transfer the pattern in the mask template to the photoresist layer. Thus, photoresist layer 102 containing the target pattern is formed on the surface of substrate 100, and the line end of the photoresist layer 102 is located on the surface of the insulator 101 or on the surface of the substrate 100 outside the insulator 101.

As shown in FIGS. 1-2, the line end of the photoresist layer 102 may not be perpendicular to the substrate 100. The line end may be rough and may be in irregular shapes. Further, the pattern on the photoresist layer 102 may be not the same as the target pattern. If the photoresist layer 102 is used as a mask in the semiconductor manufacturing processes, the final production yield may decrease drastically. And the fabricated semiconductor device does not meet the process requirements.

In general, when performing the OPC process using an OPC model, the OPC model may be established by: providing a test pattern and a substrate (e.g., a plain substrate); providing a mask template with the test pattern; performing an exposure and development process on the substrate using the mask template as a mask to form a final pattern on the surface of the substrate (e.g., in a photoresist layer); measuring the actual feature size of the final pattern to obtain measurement data. The OPC model establishing process may further include performing a photolithographical process using the provided test pattern to form a simulated final pattern on the surface of the substrate; measuring the feature size dimensions of the simulated final pattern to obtain simulated data. By comparing the measurement data and the simulated data, the OPC model can be established.

Thus, the above mentioned OPC model may only consider the plain substrate scenario. However, in real semiconductor manufacturing processes, substrates may often contain other structures, such as STIs or other insulation structures.

As shown in FIGS. 1-2, the substrate 100 may be made of silicon, and the insulation structure 101 may be made of silicon oxide. The insulation structure 101 and the substrate 100 may have a first interface 104 and a second interface 105. Because the insulation structure 101 may have inclined sidewalls, and the top width of the insulation structure 101 may be larger than the bottom width of insulation structure 101, the first interface 104 may form an angle with the surface of the substrate 100 which is not 90 degrees.

Further, because silicon oxide has a significantly high light transmittance while silicon has a significantly low light transmittance, so lithographical light 103 may be reflected at the first interface 104 and the second interface 105. The reflected light may generate undesired exposure to the photoresist layer 102, which changes the total amount of exposure to the photoresist layer 102 and deteriorate sidewall morphology of the photoresist layer 102. This phenomena may happen no matter the line ends of the photoresist layer 102 locating above the insulation structure 101 (shown in FIG. 1), or locating outside the area of the insulation structure 101 (shown in FIG. 2).

Thus, according to the above analysis, if the impact on the photoresist layer 102 from the first interface 104 and the second interface 105 is known in advance, the target pattern can be optical proximity corrected. Afterward, when performing subsequent exposure and development, the impact from the first interface 104 and the second interface 105 can be canceled. Thus, a final pattern that is consistent with the target pattern may be obtained.

According to various disclosed embodiments, a method and system for establishing OPC models and performing OPC are provided. In one embodiment, to establish an OPC model, a substrate that may contain a first region, a second region and a third region is provided. More specifically, the second region may be located between the first region and the third region, and may connect the first region to the third region. The substrate in the first and the second regions may have a layered structure including a first material layer and a second material layer. The substrate in the third region may have a single layer structure formed by the first material layer. The second material layer may have a higher light transmittance coefficient than the first material layer. Besides, along the direction from the second region to third region, the thickness of the second material layer in the second region may decrease gradually, while the thickness of the first material layer in the second region may increase gradually. After providing the substrate, aerial image light intensity functions at the first region, the second region and the third region are obtained. Next, an OPC model is established based on the aerial image light intensity functions. Finally, an OPC process is performed to the target pattern by using the OPC model. Thus, by considering the impact from implant structures (e.g., STIs) to the photoresist exposure, OPC models can be established, enhancing the quality of the final patterns that formed on the surface of the substrate.

Figure 3:
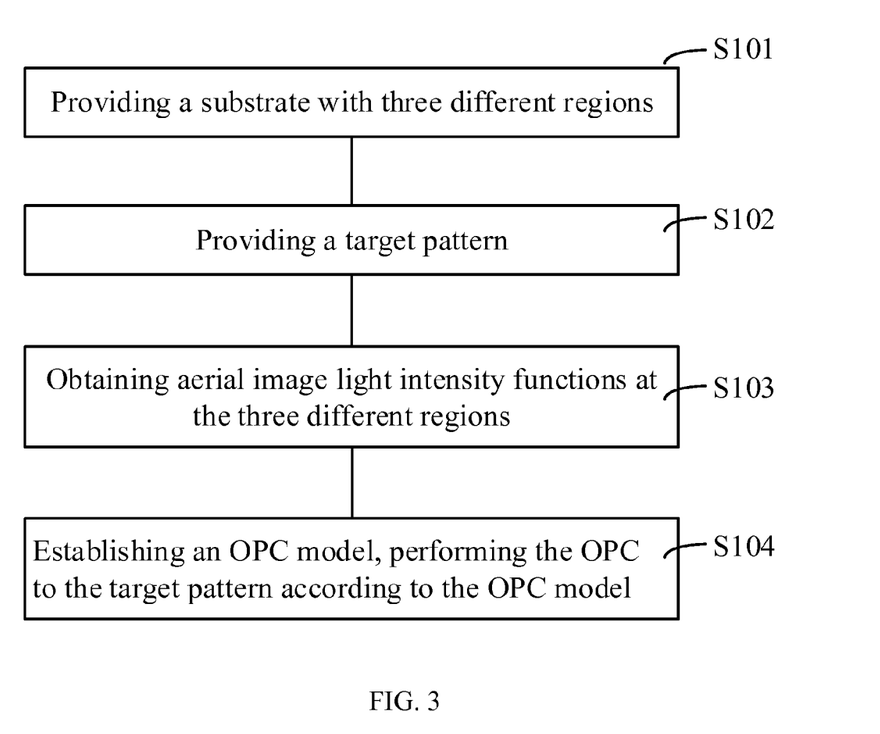
FIG. 3 illustrates a flow chart of an exemplary OPC process consistent with the disclosed embodiments.

FIG. 3 illustrates a flow chart of an exemplary OPC process consistent with disclosed embodiments. As shown in FIG. 3, the process may include the following steps.

Step S101, providing a substrate. The substrate may have a first region, a second region, and a third region. The second region may connect to the first region and the third region. The substrate in the first region and the second region may have a layered structure with a first material layer and a second material layer formed on top surface of the first material layer. The substrate in the third region may be formed by the first material layer.

Step S102, providing a target pattern.

Step S103, obtaining aerial image light intensity functions at the first region, the second region, and the third region.

Step S104, establishing an OPC model based on the aerial image light intensity functions, and performing the optical proximity correction (OPC) on the target pattern according to the OPC model.

Figure 4:
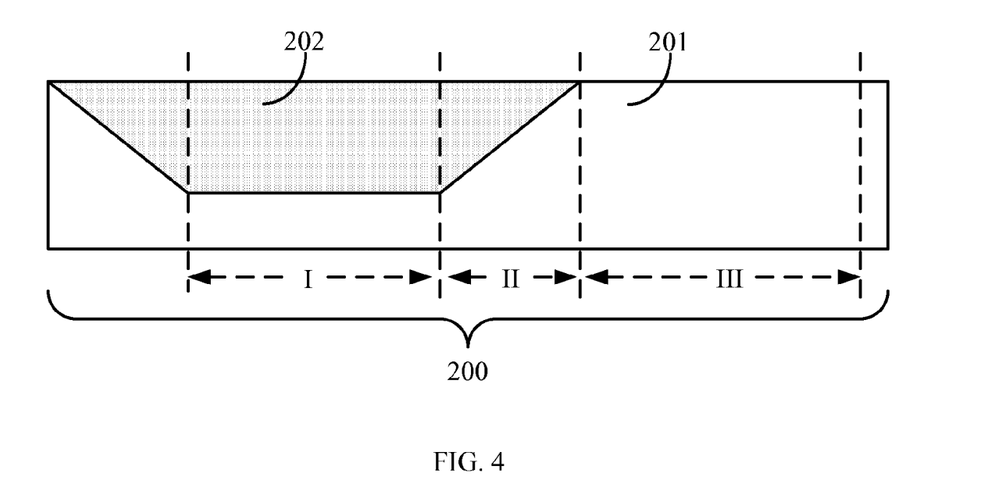
FIG. 4 illustrates a sectional view of a substrate consistent with the disclosed embodiments.

FIG. 4 illustrates a sectional view of a substrate consistent with the disclosed embodiments. As shown in FIG. 4, the substrate 200 may have three regions, which are a first region I, a second region II, and a third region III. Other regions may also be included.

The second region II may connect to the first region I and the third region III. The first region I and the second region II may have a layered structure, with a first material layer 201 located at the bottom of the substrate, and a second material layer 202 formed on top surface of the first material layer 201. The substrate 200 in the third region III is formed by the first material layer 201. Moreover, along the direction from the second region II to the third region III, the thickness of the second material layer 202 may decrease gradually, and the thickness of the first material layer 201 may increase gradually. The second material layer 202 may have a higher light transmittance than the first material layer 201.

In certain embodiments, in the first region I, the thickness of the first material layer 201 and the thickness of the second material layer 202 may keep constant. In second region II, the thickness of the second material layer 202 may decrease gradually, and thickness of the first material layer 201 located underneath the second material layer 202 may increase gradually. The substrate 200 in the third region III is formed by the first material layer 201.

Further, the first material layer 201 may be made of any appropriate type of semiconductor materials, such as silicon, germanium, silicon germanium, gallium arsenide, indium arsenide, gallium antimonite, alloy semiconductor, or a combination thereof. The second material layer 202 may be made of silicon oxide, silicon nitride, silicon oxynitride, or a combination thereof.

In practical semiconductor manufacturing processes, substrates may have insulation structures on them. Further, due to limitations of the fabrication process of the insulation structures, these insulation structures may have inclined sidewalls. The top width of the insulation structures may be larger than the bottom width of these insulation structures. In one embodiment, the substrate 200 may be a substrate with an insulation structure. The insulation structure may be made of silicon oxide, and the region where sidewalls of the isolation structure are located is the second region II.

In addition, the second material layer 202 may be made of silicon oxide, whose light transmittance may be relatively high. The first material layer 201 may be made of silicon, germanium, silicon germanium, or gallium arsenide, whose light transmittance may be lower than that of the silicon oxide. Thus, during a lithography process, as light travels through the second material layer 202 and arrives at the interface between the first layer 201 and the second material layer 202, due to the lower light transmittance of the second material layer 202, light may be reflected at the interface between the first layer 201 and the second material layer 202. The reflected light may have impact on the photoresist exposure. Comparing with the plain substrate scenario, light intensity at the same location on the substrate may change. For a standard OPC model, it may not consider the influence to the photoresist exposure from the reflected light.

Thus, according to disclosed embodiments, aerial image light intensity functions may be obtained at the first region I, the second region II, and the third region III. The OPC model may then be established based on the aerial image light intensity functions obtained from these three regions. Further, an OPC process may be performed to target patterns by using the OPC model. The OPC models established according to the disclosed embodiments may factor in the impact from the aerial image light intensity function in the second region II, and may also factor in the light reflection and light diffraction impact in the second region II. Thus, the side effect from these impact may be compensated properly, and the final pattern formed on surface of the substrate 200 may be much closer to the target pattern.

An exemplary embodiment of how to establish an OPC model based on aerial image light intensity functions is described below.

An OPC model may include an optical model and a photoresist model. The optical model may be developed by calculating coherent light imaging process using the Hopkins method. The optical model may be considered as a "white box", which may be used to predict the exposure light intensity on a substrate's surface, or called aerial image light intensity function. The photoresist model may be used to factor in the ion diffusion effect in a photoresist layer during a lithography process after obtaining an aerial image light intensity function. The photoresist model may be established by the convolution of a proper Gaussian function and the aerial image light intensity function.

Figure 5:
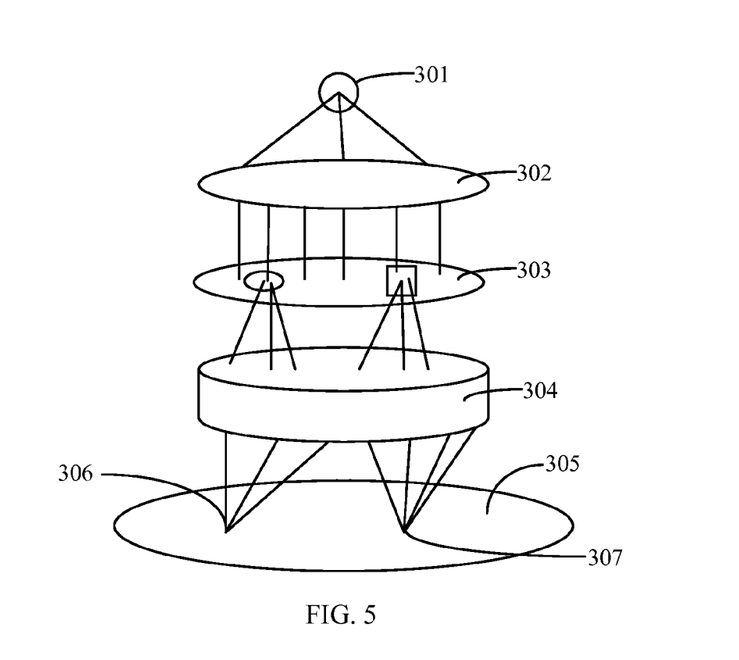
FIG. 5 illustrates a photolithography system consistent with the disclosed embodiments.

FIG. 5 shows a photo lithography system. As shown in FIG. 5, the photo lithography system may include a light source 301, an illumination lens 302, a mask 303, a projection lens system 304, and a substrate 305. During a lithography process, light from the light source 301 may become parallel light after it passing through the illumination lens 302. Then, the parallel light may pass through the mask 302 and the projection lens system 304, and may finally form a pattern image on the substrate 305.

More specifically, the optical model may actually describe the imaging formation process as a partial coherent light passing through a lens system with phase differences. The optical model may be based on the Hopkins model, which models a partial coherent optical system by using certain optical principles.

In one embodiment, process for establishing an OPC model may start by providing a standard optical model. The standard optical model may include a standard aerial image light intensity function, which may describe light intensity distribution on a plain substrate surface. The plain substrate refers to a substrate before forming any structures. According to the Hopkins theory, the standard aerial image light intensity function may be written as:

$$I(f,g) = \iint_{-\infty}^{\infty} T(f_1, g_1, f+f_1, g+g_1) F(f_1, g_1) F^*(f+f_1, g+g_1) df_1 dg_1$$

$$I(x,y) = F^{-1}\{I(f,g)\}$$

Where $I(x, y)$ is the aerial image light intensity function at the location $(x, y)$ on the substrate; $I(f, g)$ is the aerial image light intensity function $I(x, y)$ in the Fourier domain; $F(f, g)$ is the mask transmission function $F(x, y)$ in the Fourier domain; the superscript * means the complex conjugation; $T(f1, g1, f+f1, g+g1)$ is the Transmission Cross Coefficient (TCC), or called the transmission cross function. TCC may be totally irrelevant with the target pattern, but rather describes the optical system's function from its light source to its imaging plan (including illumination system and imaging system). Further, TCC may be a function that is irrelevant with the shape of a mask, which may be written as:

$$T(f_1, g_1, f_2, g_2) = \iint_{-\infty}^{\infty} J(f,g) K(f+f_1, g+g_1) K^*(f+f_2, g+g_2) df dg$$

Where $J(f, g)$ is the illumination function, which may describe the coherent property of an illumination system; $K(f, g)$ is the transfer function of the imaging system; the superscript * denotes the complex conjugation.

The Hopkins method may essentially describe a partial coherent illumination system with transfer function of a double linear system. For an optical lithography system with fixed wavelength ($\lambda$), Numerical Aperture (NA), defocus, coherent factor ($\delta$), and other phase differences, a definitive TCC may be used to describe it. After obtaining the TCC function, the aerial image light intensity function's Fourier transfer may be determined.

However, to calculate the aerial image light intensity through the Hopkins equations may involve a large amount of computation, which may be too slow for practical applications. A method called Sum of Coherent Sources (SOCS) may provide a fast solution with reasonable accuracy.

The principle of the SOCS method is to use superposition of some weighted coherent systems to approximate the partial coherent imaging system. More specifically, a system's TCC function may be discretized into a four-dimensional matrix with finite length. Then the TCC matrix may be written as superposition of a serial of weighted matrixes, as below:

$$T(f_1, g_1, f_2, g_2) = \sum_i \eta_k \Phi_k(f_1, g_1) \Phi_k^*(f_2, g_2)$$

Where $\eta_k$ are eigenvalues of the TCC matrix; $\Phi_k$ are eigenvectors of the TCC matrix; and the superscript * denotes the complex conjugation.

Thus the standard aerial image light intensity function $I(x, y)$ may be rewritten as:

$$I(x, y) = \sum_k \eta_k |\Phi_k(x, y) \otimes F(x, y)|$$

Where ⊗ denotes the convolution operator.

According to the above analysis, it can be viewed that an optical imaging system property which may be described by a TCC function may depend on certain parameters including light source wavelength, numerical aperture, magnification coefficient, light source coherent system, etc. The TCC function of a photolithography system may be established by calculating its illumination function, its imaging system's frequency response function, etc. Calculating the aerial image light intensity may depend on the TCC function in addition to the mask portion, so that the TCC function may be treated as the transfer function of an optical imaging system. That is, by inputting the mask information, the simulated lithography result may be obtained by the TCC function.

In one embodiment, the substrate 200 may include a first region I, a second region II and a third region III. The second material layer 202 in the first region I, in the second region II, and in the third region III may have certain impact to the aerial image light intensity function. As in the first region I, the thickness of the first material layer 201 and the thickness of the second material layer 202 may keep constant, so an aerial image light intensity function from any point on surface of the substrate 200 in the first region I may serve as the aerial image light intensity function of the first region I. Similarly, the aerial image light intensity function on surface of the third region III can be obtained.

As for the second region II, because the thickness of the second material layer 202 in this region may change, the light reflection and light diffraction influence on surface of the substrate 200 within this region may also change. Thus, the aerial image light intensity function on surface of the second region II may be different on different locations. To obtain the optical model of the second region II of the substrate 200, aerial image light intensity function of different locations or points on the surface of the second region II of the substrate 200 may need to be obtained. Each aerial image light intensity function may correspond to a certain thickness of second material 202 layer, and may serve as a subset of the total aerial image light intensity function of the second region II. The final aerial image light intensity function of the second region II may be a collection of these subsets functions.

Because the second region II of the second material layer 202 may have an infinite number of thickness values, the number of optical sub-models to be established may also be indefinite, which makes establishing an optical model for second region II of the substrate 200 involving a substantially large amount of computation. On the other hand, if a relationship between the aerial image light intensity function on surface of the substrate 200 and the standard aerial image light intensity can be established, the amount of calculation needed may be significantly reduced.

Further, with respect to the aerial image light intensity on surface of the substrate 200, unlike the plain substrate, the aerial image light intensity on surface of the substrate 200 changes when the thickness of the second material layer 202 in the substrate 200 changes. For the first region I, because the thickness of the first material layer 201 and thickness of the second material 202 are constant, the impact from the first region I to the aerial image light intensity on the surface of the substrate 200 may also be a definite value. This definite value may be defined as a first correction function $G_1(x, y)$. $G_1(x, y)$ may be a continuous function, where (x, y) may define a position with coordinate (x, y) on the surface of the substrate 200. Because a pattern formed on surface of the substrate 200 is two-dimensional, the aerial image light intensity function $I_1(x, y)$ on the surface of the substrate 200 in the first region I may be treated as of the convolution of the first correction function $G_1(x, y)$ and the standard aerial image light intensity function $I(x, y)$, which may be written as:

$$I_1(x,y) = G_1(x,y) \otimes I(x,y)$$

As for the third region III of the substrate 200, the substrate 200 in the third region III may be treated as a plain substrate, because the substrate 200 does not have the second material layer 202. The influence from the third region III to the aerial image light intensity on surface of the substrate 200 may also be a definitive value, which may be defined as a third correction function $G_3(x, y)$. $G_3(x, y)$ may be a continuous function. Similarly, the aerial image light intensity function $I_3(x, y)$ on surface of the substrate 200 in the third region III may be treated as of the convolution of the third correction function $G_3(x, y)$ and the standard aerial image light intensity function $I(x, y)$, which may be written as:

$$I_3(x,y) = G_3(x,y) \otimes I(x,y)$$

As for the second region II, the thickness of the second material layer 202 varies. The impact from this region to the aerial image light intensity on surface of the substrate 200 may be calculated by considering the thickness and material property of the second material layer 202, which is the relationship between the aerial image light intensity function and the thickness of the second material layer 202. This function may be defined as a second correction function $G_2(x, y)$. Moreover, due to restrictions in semiconductor manufacturing processes, the interface between the first material layer 201 layer and the second material layer 202 layer may be a smooth surface. In another word, the thickness of the second material layer 202 may change continuously, thus the second correction function $G_2(x, y)$ may also be a continuous function. Similarly, the aerial image light intensity function $I_2(x, y)$ on surface of the substrate 200 in the second region II may be treated as of the convolution of the second correction function $G_2(x, y)$ and the standard aerial image light intensity function $I(x, y)$, which may be written as:

$$I_2(x,y) = G_2(x,y) \otimes I(x,y)$$

In addition, because the first correction function $G_1(x, y)$, the second correction function $G_2(x, y)$, and the third correction function $G_3(x, y)$ are all continuous functions, the overall influence from the second material layer 202 to the aerial image light intensity function may be unified as an overall correction function $G(x, y)$. The overall correction function $G(x, y)$ may be a collection of the first correction function $G_1(x, y)$, the second correction function $G_2(x, y)$, and the third correction function $G_3(x, y)$, and the correction function $G(x, y)$ may also be a continuous function.

Thus, the overall aerial image light intensity function $I_{topo}(x, y)$ for the all the three regions on the substrate 200 may be treated as of the convolution of the overall correction function $G(x, y)$ and the standard aerial image light intensity function $I(x, y)$, which may be written as:

$$I_{topo}(x,y) = G(x,y) \otimes I(x,y)$$

In one embodiment, since Gaussian function is a continuous function, which may be able to reflect impact from the variation in thickness of the second material layer 202 layer to the aerial image light intensity function, the Gaussian function may be used as the overall correction function G(x, y). In certain embodiments, other continuous functions may be used as the overall correction function.

After obtaining the aerial image light intensity function $I_{topo}(x, y)$, the OPC model may be established based on the aerial image light intensity function $I_{topo}(x, y)$. The OPC model may include an optical model and a photoresist model. The aerial image light intensity function may be used to establish the optical model. In one embodiment, the optical model may be a product of a Gaussian function and a standard optical model.

As for the photoresist model, the photoresist model may be developed by using the convolution of the aerial image light intensity function $I_{topo}(x, y)$ and a Gaussian function, where the Gaussian function may have a standard deviation. The Gaussian function may reflect the iron diffusion effect in photoresist. The standard deviation may be determined by actual measurement data.

It should be noted that, since the photoresist layer may have certain thickness, the influence from photoresist thickness may also be taken into consideration after obtaining the aerial image light intensity function.

Thus, during the disclosed OPC model establishment process, a substrate containing a first region, a second region, and a third region is provided. The substrate in the first region and the second region may have a layered structure with a first material layer and a second material layer formed on top surface of the first material layer. The substrate in the third region may be formed by the first material layer. Further, along the direction from the second region to the third region, the thickness of the second material layer may decrease gradually, and the thickness of the first material layer may increase gradually. The second material layer may have a higher light transmittance than the first material layer. That is the substrate may be a substrate with insulation structures. Moreover, the aerial image light intensity functions are obtained at the first region, the second region, and the third region. Because the aerial image light intensity functions are obtained based on the substrate consistent with the current disclosure, the aerial image light intensity functions may factor in the impact on the light reflection and diffraction from the insulation structures located on the substrate. And the OPC model established based on the aerial image light intensity functions may factor in the impact on the photoresist exposure from the insulation structures located on the substrate. Thus when performing an OPC process to the target pattern by applying the OPC model, the obtained target pattern with OPC may factor in the impact on the photoresist exposure from the insulation structures on the substrate. Hence, when using the target pattern with OPC as a mask to do photolithography, the undesired exposure to the photoresist from the insulation structures influence may be canceled. Thus the final pattern formed on the surface of the substrate may have a better quality, and may be much closer to the target pattern.

Moreover, the standard optical model may include a standard aerial image light intensity function. The standard aerial image light intensity function may describe the light intensity distribution on a plain substrate surface. Further, the relationship between the aerial image light intensity function and the thickness and the material property of the second material layer may be obtained and may be defined as a correction function. Then the aerial image light intensity function on the surface of the substrate may be obtained by the convolution of the correction function and the standard aerial image light intensity function. In one embodiment, the optical model may be the product of a Gaussian function and a standard optical model. The aerial image light intensity function computation method as illustrated in this disclosure may reduce the computation time that needed for establishing the OPC model. Thus the effort for obtaining the OPC model may be reduced significantly, and the semiconductor manufacturing efficiency may be improved substantively.

Figure 6:
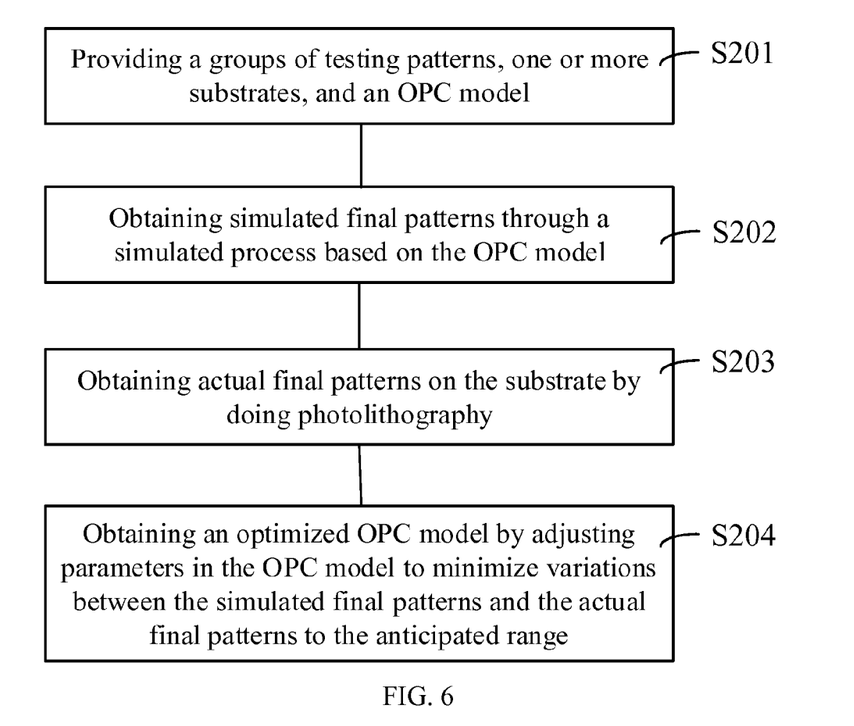
FIG. 6 illustrates a flow chart of an exemplary OPC model optimization process consistent with the disclosed embodiments.

FIG. 6 illustrates a flow chart of an exemplary OPC model optimization process consistent with the disclosed embodiments. As shown in FIG. 6, the OPC model optimization process may include the following steps.

Step S201, providing a plurality of groups of testing patterns, one or more substrates as described above, and an OPC model established previously.

Step S202, obtaining simulated final patterns through a simulated exposure on the test patterns based on the OPC model.

Step S203, obtaining actual final patterns on the substrate by doing photolithography with the testing patterns as a mask; and Step S204, obtaining variations between the simulated final patterns and the actual final patterns. If the variations are beyond the anticipated range, it may needs to adjust the OPC model, and then repeat the above steps until the variations between the simulated final patterns and the actual final patterns are within the anticipated range. The OPC model obtained after adjustment is the optimized OPC model.

Further, the substrates and the OPC model used in the step S201 have been illustrated extensively previously, the details of which are omitted herein. In practical semiconductor manufacturing processes, due to influence from certain factors, the real photolithography system may not be exactly the same as the OPC model which obtained through a theoretical computation process, and the data measured from the actual photolithography patterns may be different with the data measured from the simulated photolithography patterns. Thus the OPC model may needs to be adjusted according to the actual photolithography result to further minimize the variations between the data obtained from the simulated photolithography and the data obtained from the actual photolithography.

More specifically, the OPC model optimization process may include: adjusting parameters in the aerial image light intensity functions belong to the optical model and/or adjusting parameters in the Gaussian function belonging to the photoresist model. The OPC optimization process may further include adjusting the optical model and the photoresist model according to certain empirical equations. The objective is to make the optimized OPC model reflect the actual photolithography process.

To optimize the OPC model, a plurality of groups of testing patterns, and one or more substrates are provided. FIGS. 7-10 illustrate the position relationships between the testing patterns and the substrates, which may actually be the position relationships between the patterns that formed in a photoresist layer on the substrates after an exposure and developing process and the substrates themselves.

As shown in FIGS. 7-10, the substrate 300 may have three regions which are a first region 310, a second region 320, and a third region 330. The testing patterns may include a first testing pattern 400, a second testing pattern 500, a third testing pattern 600, and a fourth testing pattern 700. The structure and material property of the substrate 300 may be similar to those of the substrate 200 as illustrated previously, the details of which are omitted herein.

A requirement to the testing patterns may need the test patterns cover graphs and graphic combinations that usually occur during semiconductor manufacturing processes. The testing patterns may also need to consider certain threshold scenarios. Moreover, in certain embodiments the position relationships between the testing patterns and the substrates may need to be considered.

Figure 7:
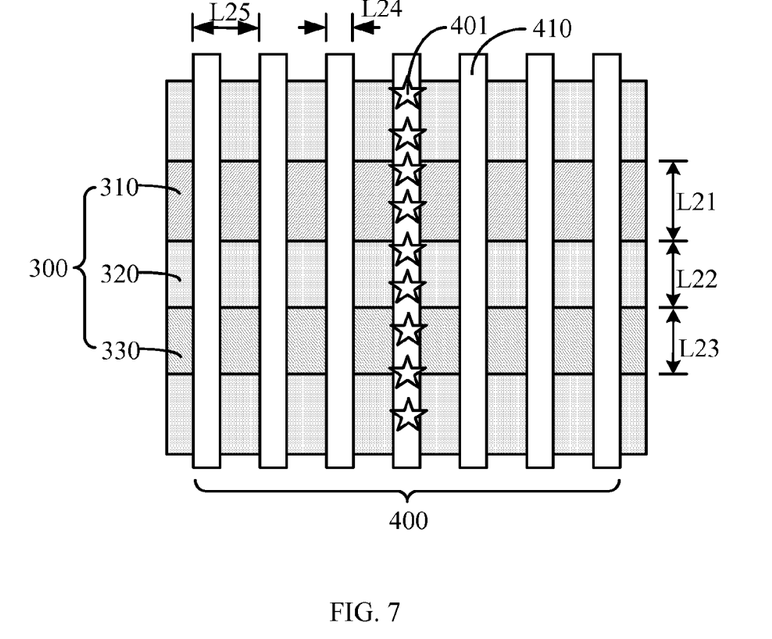
FIGS. 7-10 illustrate position relationships between testing patterns and substrates consistent with the disclosed embodiments.

FIG. 7 illustrates the position relationship between the first testing pattern 400 and the substrate 300. As shown in FIG. 7, the first testing pattern 400 may cover the whole surface of the substrate 300. Certain testing points 401 may be set at the first region 310, the second region 320, and the third region 330 corresponding to the first testing pattern 400 on the substrate 300.

As shown in FIG. 7, the first region 310 may have a first line width L21, the second region 320 may have a second line width L22, and the third region 330 may have a third line width L23. The first testing pattern 400 may have a line width L24, with a line space L25.

Further, the first testing pattern 400 may contain certain subset testing patterns 410. The subset testing patterns 410 may cover the whole surface of the substrate 300, including the first region 310, the second region 320, and the third region 330. Certain testing points 401 may be set at the first region 310, the second region 320, and the third region 330 corresponding to the subset testing patterns 410 on the substrate 300.

By using the testing points 401 that correspond to the subset testing patterns 410, the efficiency of the OPC model optimization process may increase. Because, measurements may need to be carried out only at these testing points 401 after obtaining the simulated final patterns and actual final patterns, which may significantly reduce the efforts that needed for the measurement process. Further, the OPC model may need to consider impact from the first region 310, the second region 320, and the third region 330 on the substrate 300, thus the testing points 401 may need to be set in all these three regions corresponding to the subset testing patterns 410.

In addition, during the subsequent simulated and actual exposure and developing process of the first testing pattern 400, feature size of the testing pattern 400, feature size of the first region, the second region, and the third region may be changed to obtain multiple simulated data and actual data. The variations between these multiple simulated data and actual data may be obtained accordingly. More specifically, the first line width L21, the second line width L22, and the third line width L23 on the substrate 300 may be changed one at a time, or may be changed multiple at the same time. The line width L24 and the line space L25 on the testing pattern 400 may be changed one at a time, or may be changed together at the same time. Then the simulated data and the actual data may be obtained at these testing points 401.

Figure 8:
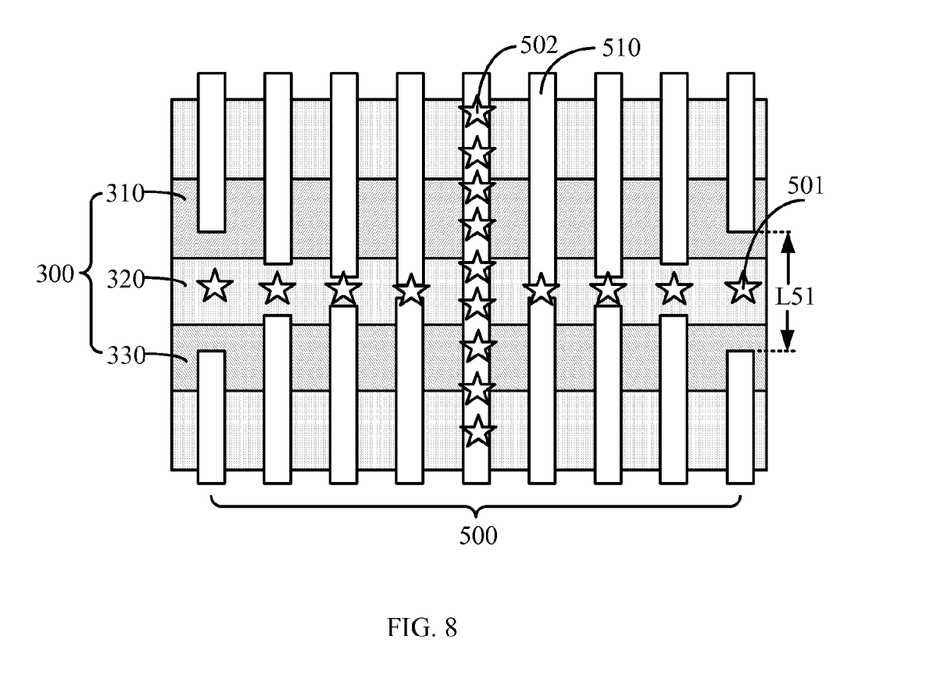

FIG. 8 illustrates the position relationship between the second testing pattern 500 and the substrate 300. As shown in FIG. 8, the patterns between the line ends of the second testing pattern 500 may be located at the second region 320 on the substrate 300. The patterns locating between the line ends may have certain different width L51.

Further, the second testing pattern 500 may contain certain subset testing patterns 510. The subset patterns 510 may have a tip to tip arrangement. The patterns between the line ends of the subset testing patterns 510 may be located at least partially at the second region 320 on the substrate 300. Thus, after an exposure and developing process, patterns formed on the substrate 300 that consistent with the testing pattern 500 may partially expose the surface of the second region 320.

As shown in FIG. 8, certain testing points 501 may be set on the substrate 300 at the second region 320 corresponding to the patterns between the line ends of the testing pattern 500. Moreover, the patterns between the line ends of the testing pattern 500 may have certain different width. In another word, the testing points 501 are located at the second region on the surface of the substrate 300. And the testing points 501 may have an equal distance to the line ends of a pair of the tip to tip structure belonging to the subset testing patterns 510.

Further, the second testing pattern 500 may contain certain continuous subset testing patterns 510 (patterns without break) to further optimize the OPC model. Certain auxiliary testing points 502 may be set on these continuous patterns, and may be located at the first region 310, the second region 320, and the third region 330 on the substrate 300 corresponding to the subset testing patterns 510.

Figure 9:
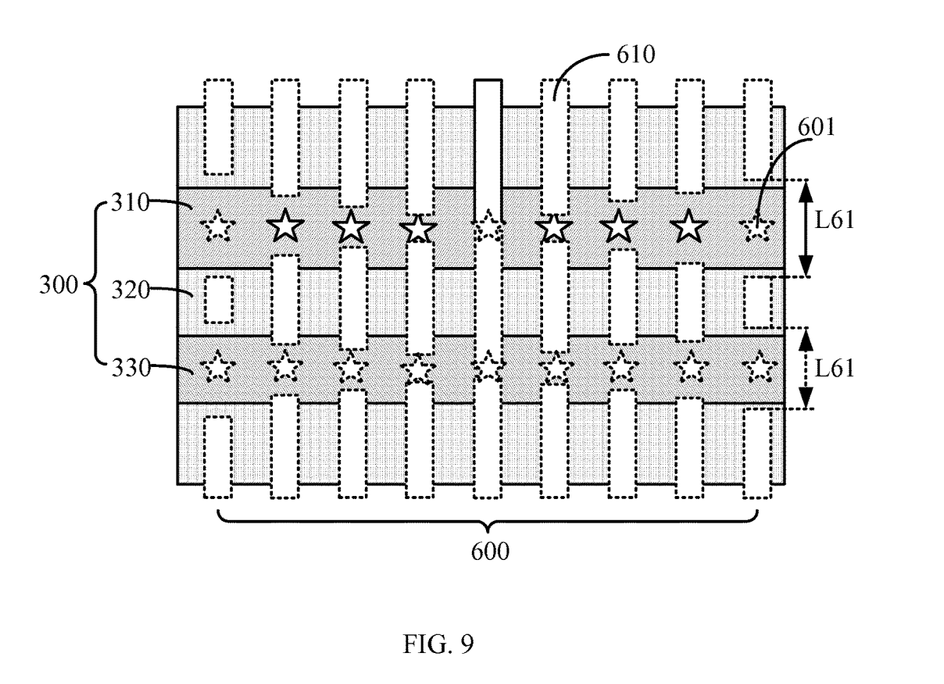

FIG. 9 illustrates the position relationship between the third testing pattern 600 and the substrate 300. As shown in FIG. 9, the patterns between the line ends of the third testing pattern 600 may be located at the first region 310 and the third region 330.

Further, the third testing pattern 600 may contain certain subset patterns 610. The subset patterns 610 may have a tip to tip arrangement. The patterns between the line ends of the subset testing patterns 610 may be located at the first region 310 and the third region 320. The patterns between the line ends of the subset testing patterns 610 may have certain different width L61.

As shown in FIG. 9, certain testing points 601 may be set between the line ends of the subset testing patterns 610 in the first region 310 and the third region 330 on the substrate 300. And the testing points 601 may have an equal distance to the line ends of a pair of the tip to tip structure belonging to the subset testing patterns 610.

Figure 10:
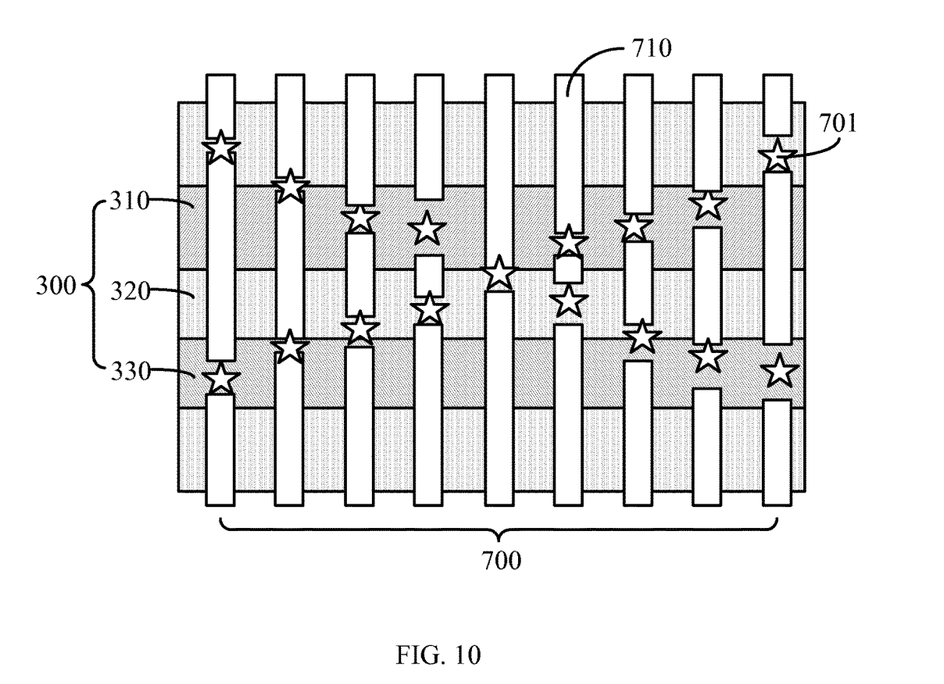

FIG. 10 illustrates the position relationship between the forth testing pattern 700 and the substrate 300. As shown in FIG. 10, the patterns between the line ends of the testing pattern 700 may be located at the first region 310, the second region 320, and the third region 330 on the substrate 300. The patterns between the line ends of the testing pattern 700 may have certain different width in all the three regions. Certain testing points 701 may be set between the line ends of the testing pattern 700.

Further, the fourth testing pattern 700 may contain certain subset testing patterns 710. The patterns between the line ends of the subset testing patterns 710 may be located at the first region 310, the second region 320, and the third region 330. The testing points 701 may be located between the line ends of the subset testing pattern 710 on the substrate 300. And the testing points 701 may not be located at the middle between the line ends of the subset testing patterns 710.

After forming the above testing patterns, a simulated exposure and developing process of these testing patterns may be performed based on the OPC model to obtain simulated final patterns.

More specifically, the OPC model may be obtained by the methods illustrated previously in this disclosure. The testing patterns may at least include the first testing pattern 400, the second testing pattern 500, the third testing pattern 600, and the fourth testing pattern 700. The testing patterns may be formed on one mask, or may be formed on separate masks.

Further, by measuring feature size dimensions of the simulated final patterns, simulated data of these simulated final patterns may be obtained. To simplify the measurement process, after forming the simulated final patterns, measurement may be performed at the testing point locations to obtain the simulated data corresponding to the testing patterns.

Moreover, a real photo lithographical process may be performed by using these testing patterns as masks to obtain actual final patterns on the substrate 300. Then, measuring feature size dimensions of the actual final patterns to obtain the actual data. To simply the measurement process, after forming the actual final patterns, measurement may be performed at the testing point locations to obtain the actual data corresponding to the testing patterns.

In addition, there may be some variations between the simulated final patterns that obtained by a simulation process using the OPC model and the actual final patterns that obtained by a real photo lithographical process. If the variations between the simulated final patterns and the actual final patterns are beyond the anticipated range, the OPC model may need to be optimized to bring these two patterns closer. The optimized or desired OPC model may able to compensate the target pattern better.

More specifically, the OPC model optimization process may include obtaining the variations between the simulated final patterns and the actual final patterns. If the variations are beyond the anticipated range, then adjusting the OPC model until the variations between the simulated final patterns and the actual final patterns are within the anticipated range. The final OPC model obtained after the adjustment process is the optimized OPC model.

Further, the method to obtain the variations between the simulated final patterns and the actual final patterns may include: measuring the feature size dimensions CD1 of the simulated final patterns; measuring the feature size dimensions CD2 of the actual final patterns; obtaining the variations between the data from the simulated final patterns and the data from the actual final patterns. As an example, the variations may be defined as the square of the absolute value of the difference between CD1 and CD2. The anticipated variation range may be determined by the practical manufacturing processes requirements.

Moreover, to adjust the OPT model, parameters in the aerial image light intensity functions belonging to the optical model and/or parameters in the Gaussian function belonging to the photoresist model may be adjusted.

In addition, the method for determining whether the OPC model obtained after the adjustment process is optimized or not may include: forming a simulated final pattern by using the testing pattern and the adjusted OPC model; obtaining the simulated data by measuring feature size dimensions of the simulated final pattern; forming an actual final pattern by performing a real photo lithographical process to the testing pattern; obtaining the actual measurement data by measuring feature size dimensions of the actual final patterns. If the variations between the simulated data and the actual measurement data are within the anticipated range, the OPC model obtained after the adjustment process is the optimized OPC model. Otherwise, it may need to repeat the OPC model optimization process until the optimized OPT model is obtained.

More specifically, during the disclosed OPC optimization process, a plurality of groups of testing patterns, one or more substrates as described above, and an OPC model established previously are provided. Then, the simulated final patterns are obtained by performing a simulated exposure and developing process to the testing patterns based on the OPC model. And the actual final patterns on the surface of the substrate are obtained by performing a real photo lithographical process with the testing patterns as a mask.

If the variations between the simulated final patterns and the actual final patterns are beyond the anticipated range, the OPC model may needs to be adjusted, until the variations between the simulated final patterns and the actual final patterns are within the anticipated range. The OPC model obtained after the adjustment is the optimized OPC model. After adjusting the OPC model, the obtained optimized OPC model may matches the actual exposure and developing process better. Thus, when applying the optimized OPC model to a target pattern to perform the OPC, and then using the target pattern with OPC as a mask to do lithography, the final pattern formed on the surface of a substrate may have a desired quality.

Further, an OPC system may also be provided according to the disclosed embodiments. An exemplary OPC system consistent with the present disclosure may include an OPC model establishment process. The OPC model establishing process may include providing a substrate with a first region, a second region and a third region as describe before; providing a target pattern; obtaining aerial image light intensity functions at the first region, the second region and the third region; establishing the OPC model based on the aerial image light intensity functions.

Further, the OPC system consistent with the present disclosure may further include an OPC model optimization process. The OPC model optimization process may include providing a plurality of groups of testing patterns, one or more substrates as described above, and an OPC model established previously; obtaining simulated final patterns through a simulated exposure on the test patterns based on the OPC model; obtaining actual final patterns on the substrate by doing photolithography with the testing patterns as a mask; and obtaining variations between the simulated final patterns and the actual final patterns. If the variations are beyond the anticipated range, the OPC model is adjusted. Then, repeat the above steps until the variations between the simulated final patterns and the actual final patterns are within the anticipated range. The OPC model obtained after the adjustment is the optimized OPC model.

In addition, the OPC system consistent with the present disclosure may further include obtaining a pattern with OPC by performing an OPC process to the target pattern using the optimized OPC model; obtaining a mask that contains the target pattern with OPC; transferring the pattern in the mask to the photoresist layer by performing a real photo lithographical process.

Embodiments consistent with the current disclosure provide methods and a systems for optical proximity correction. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. An Optical Proximity Correction (OPC) method, comprising:
    providing a substrate having at least one semiconductor structure and with a plurality of regions, the plurality of regions having a stack layered first region, a stack layered second region and a single layered third region;
    providing a target pattern to be formed on the substrate;
    respectively obtaining aerial image light intensity functions of the stack layered first region, the stack layered second region and the single layered third region;

establishing an OPC model based on the aerial image light intensity functions of the plurality of regions; and performing an OPC process to the target pattern by using the OPC model to adjust the target pattern factoring in optical effect of the plurality of regions.

2. The method according to claim 1, wherein
the stack layered first region has a first material layer locating at the bottom and a second material layer locating on top surface of the first material layer;
the stack layered second region has the first material layer locating at the bottom and the second material layer locating on top surface of the first material layer; and
the single layered third region has the first material layer, wherein the second region connects to the first region and the third region.

3. The method according to claim 2, wherein:
a thickness of the first material layer in the first region and a thickness of the second material layer in the first region are constant;
a thickness of the second material layer in the second region decreases gradually when transiting from the first region to the third region;
a thickness of the first material layer in the second region increases gradually when transiting from the first region to the third region; and
a thickness of the first material layer in the third region is constant.

4. The method according to claim 2, wherein:
the second material layer in the second region has a higher light transmittance than the first material layer in the second region.

5. The method according to claim 2, wherein:
the first material layer in each of the plurality of regions is made of at least one of silicon, germanium, silicon germanium, gallium arsenide, indium arsenide, gallium antimonite, and alloy semiconductor; and
the second material layer in each of the first region and the second region is made of at least one of silicon oxide, silicon nitride, and silicon oxynitride.

6. The method according to claim 2, wherein:
line ends of the target pattern to be formed on the surface of the substrate are located in the first region, the second region, and the third region.

7. The method according to claim 2, wherein:
the OPC model include an optical model and a photoresist model; and
the optical model is established based on the aerial image light intensity functions.

8. The method according to claim 7, wherein establishing the OPC model further includes:
creating a standard optical model includes a standard aerial image light intensity function which describes the light intensity distribution on the surface of a plain substrate; and
establishing the OPC model as a convolution of an continuous correction function and the standard aerial image light intensity function.

9. The method according to claim 8, wherein:
the correction function is established based on relationship between the aerial space light intensity distribution and a thickness and material property of the second material layer at different positions in the second region.

10. The method according to claim 9, wherein:
the correction function is a Gaussian function; and
the optical model is the product of an Gaussian function and the standard optical model.

11. The method according to claim 7, wherein:
the photoresist model is the convolution of the aerial image light intensity functions and a Gaussian function with a standard deviation.

12. A method for optimizing an OPC model, comprising:
providing a substrate having at least one semiconductor structure and with a plurality of regions; obtaining aerial image light intensity functions at the first region, the second region and third region;
establishing an OPC model based on the obtained aerial image light intensity functions;
providing a plurality of testing patterns;
forming simulated final patterns by simulating a photo lithographical process on these target patterns based on the OPC model;
forming actual final patterns on a surface of the substrate by performing a real exposure and developing process using the testing patterns as masks;
obtaining variations between the simulated final patterns and the actual final patterns;
adjusting the OPC model and repeating the simulation and fabrication process until the variations between the simulated final patterns and the actual final patterns are within a predetermined range to obtain a desired OPC model.

13. The method according to claim 12, wherein adjusting the OPC model includes:
adjusting at least parameters in the aerial image light intensity functions belonging to a optical model or parameters in a Gaussian function belonging to a photoresist model.

14. The method according to claim 12, wherein obtaining variations between the simulated final patterns and the actual final patterns includes:
measuring and comparing feature size dimensions of the simulated final patterns that formed by a simulation process and feature size dimensions of the actual final patterns that formed by a real photolithography process.

15. The method according to claim 13, wherein:
measuring is performed at certain testing points corresponding to the testing patterns to obtain the variations between the simulated final patterns and the actual final patterns at the certain testing points.

16. The method according to claim 15, wherein:
the testing patterns cover entire surface of the substrate, with testing points set in the first region, the second region, and the third region.

17. The method according to claim 16, wherein:
the feature size of the testing patterns, the feature size of the substrate in the first region, the second region, and the third region are changeable.

18. The method according to claim 15, wherein:
patterns between line ends of the testing patterns are located in the second region, and have different width from the testing patterns.

19. The method according to claim 15, wherein:
patterns between line ends of the testing patterns are located in the first region and the third region, and have different width from the testing patterns.

20. The method according to claim 18, wherein:
patterns between line ends line ends of the testing patterns are located in the first region, the second region, and the third regions, and have different width from the testing patterns.

* * * * *